(12) United States Patent
Jang et al.

(10) Patent No.: US 7,920,030 B2
(45) Date of Patent: Apr. 5, 2011

(54) MULTI-PHASE VOLTAGE-CONTROL OSCILLATOR

(75) Inventors: Sheng-Lyang Jang, Taipei (TW); Yun-Hsueh Chuang, Taoyuan County (TW); Ren-Hong Yen, Taipei (TW); Shao-Hua Lee, Taipei County (TW)

(73) Assignee: National Taiwan University of Science and Technology, Taipei (TW)

( * ) Notice: Subject to any disclaimer, the term of this patent is extended or adjusted under 35 U.S.C. 154(b) by 15 days.

(21) Appl. No.: 12/431,764

(22) Filed: Apr. 29, 2009

(65) Prior Publication Data

US 2009/0231047 A1  Sep. 17, 2009

Related U.S. Application Data

(62) Division of application No. 11/616,899, filed on Dec. 28, 2006, now Pat. No. 7,551,038.

(30) Foreign Application Priority Data

Nov. 7, 2006  (TW) ................................ 95141131 A

(51) Int. Cl.
*H03B 27/00* (2006.01)
*H03B 5/12* (2006.01)
*H01L 23/66* (2006.01)

(52) U.S. Cl. ..... 331/45; 331/36 L; 331/47; 331/117 FE; 331/177 V; 331/181

(58) Field of Classification Search ............ 331/2, 36 L, 331/45–48, 117 FE, 117 R, 167, 177 V, 181
See application file for complete search history.

(56) References Cited

U.S. PATENT DOCUMENTS

| | | | |
|---|---|---|---|
| 6,639,481 B1 * | 10/2003 | Ravi et al. .................. | 331/177 V |
| 6,891,444 B2 * | 5/2005 | Jacobsson et al. ......... | 331/117 R |
| 7,005,930 B1 * | 2/2006 | Kim et al. ....................... | 331/46 |
| 7,239,209 B2 * | 7/2007 | Adan ......................... | 331/117 R |
| 7,423,495 B2 * | 9/2008 | Bevilacqua et al. .... | 331/117 FE |

\* cited by examiner

*Primary Examiner* — Robert Pascal
*Assistant Examiner* — Levi Gannon
(74) *Attorney, Agent, or Firm* — Jianq Chyun IP Office

(57) ABSTRACT

A multi-phase voltage-control oscillator including a first voltage-control oscillator circuit and a second voltage-control oscillator circuit is provided. The second voltage-control oscillator circuit and the first voltage-control oscillator circuit have a plurality of inductors, and the inductors in the second voltage-control oscillator circuit are respectively cross-coupled with the inductors in the first voltage-control oscillator circuit to generate a mutual inductance effect, so as to output a plurality of oscillating signals with different phases.

2 Claims, 8 Drawing Sheets

MULTI-PHASE VOLTAGE-CONTROL OSCILLATOR

CROSS-REFERENCE TO RELATED APPLICATION

This application is a divisional of and claims priority benefit of an application Ser. No. 11/616,899, filed on Dec. 28, 2006, now allowed, which claims the priority benefit of Taiwan application serial no. 95141131, filed on Nov. 7, 2006. The entirety of each of the above-mentioned patent applications is hereby incorporated by reference herein and made a part of this specification.

BACKGROUND OF THE INVENTION

1. Field of Invention

The present invention relates to a multi-phase voltage-control oscillator (VCO) structure. More particularly, the present invention relates to a structure with inductors between which an inductance effect is generated.

2. Description of Related Art

Currently, with the progress of communication industry, integrated circuits (IC) have been widely applied in wireless communication. In design, the ICs must meet several requirements such as low-voltage operation and low power consumption. In a wireless communication system, after the antenna receives a radio frequency (RF) signal, a frequency down converter constituted of an LNA, a VCO, and a mixer is used to down-convert the RF signal to an intermediate frequency signal. For the signal to be transmitted, a frequency up converter constituted of a VCO, a mixer, and a high-power amplifier is used to up-convert the intermediate frequency signal to the RF signal, and then the up-converted signal is transmitted via the antenna. A RF microwave circuit is located at the most front electrode of the entire communication system, and the characteristic of the RF microwave circuit directly affects the quality of communication, so the RF microwave circuit is a crucial part.

The VCO plays an important role in modern communication systems. As the frequency up- and down-conversion is mainly performed by the mixers at the front electrode of the VCO and the transmitter/receiver, the noise of the VCO will influence the noise level of the entire transceiver. Therefore, it is an important subject how to reduce the phase noise of the VCO.

Since the architecture adopted by the RF receiver is a distinct one, the requirements for the multi-phase signal become relatively strict. A quadrature-phase signal, for example, can be generated by the following methods.

(1) Combination of VCO, polyphase-filter, and output buffers. In this method, four output buffers are required. If the four output buffers are disposed between the filter and the VCO, the output buffer consumes a lot of power. If the output buffer between the filter and VCO is removed, the capacitance of a resonance cavity increases accordingly, resulting in large power consumption and the increase of the phase noise. In addition, in order to obtain a good match of the filter, the integration is the only choice. Therefore, the method of generating the quadrature-phase signal has a disadvantage of requiring large chip area.

(2) Frequency division. In this method, the required chip area is small. However, the structure must use a master-slave flip-flop which must operate at a frequency same as that of the VCO, i.e. twice of the operating frequency. Therefore, this method has a problem of large power consumption.

(3) Two cross-coupled VCOs. The power consumption of this method is much less than that of the above two forms. However, the method has a disadvantage that the use area is twice of a typical differential VCO area.

The current quadrature-phase VCO (QVCO) mostly uses a so-called LC tank as a basic oscillator architecture and an additional MOS device to generate a coupled signal. The method has lower phase noise, and the QVCO adopting the LC tank can be classified into two categories.

The first are those having the MOS device generating the coupled signal connected in parallel with the MOS device generating a negative resistance in the LC tank VCO architecture. Referring to FIG. 1, a circuit diagram of an LC tank QVCO is provided. The architecture is characterized in that the phase error of the quadrature-phase output is closely relevant to the MOS device generating the coupled signal. The bigger the MOS device generating the coupled signal is, the smaller the phase error of the quadrature-phase signal output by the QVCO is. However, the oversized coupled MOS device results in that the phase noise get worse due to the extra coupled MOS device, and also incurs an additional current consumption, which leads to a great increase of power consumption.

The second are those having the MOS device generating the coupled signal connected in series with the MOS device generating the negative resistance in the LC tank VCO architecture, in which there are two placement manners of the two MOS devices. Referring to FIG. 2, the MOS device generating the coupled signal can be placed at the source of the MOS device generating the negative resistance in the LC tank VCO architecture, which is called as the bottom-series QVCO. Referring to FIG. 3, the MOS device generating the coupled signal can also be placed at the drain of the MOS device generating the negative resistance in the LC tank VCO architecture, which is called as the top-series QVCO. The top-series QVCO has a better performance than the bottom-series QVCO.

Although the performance of the second series architecture is better than that of the parallel QVCO, as the stacked MOS devices are disposed in the path from the voltage supply electrode to ground electrode of the series architecture, the circuit cannot operates under low voltage supply.

Therefore, it is a problem to be solved how to operate the multi-phase VCO under low voltage and maintain good performance.

SUMMARY OF THE INVENTION

Accordingly, the present invention is directed to providing a multi-phase VCO capable of operating under low voltage and having good performance.

A VCO comprising a first VCO circuit and a second VCO circuit is provided. The first VCO circuit and the second VCO circuit have a plurality of inductors, and the inductors in the first VCO circuit are respectively coupled to the corresponding inductors in the second VCO circuit to generate a mutual inductance effect, so as to output a plurality of oscillating signals.

According to the design concept of the multi-phase VCO of the present invention, the individually-operated inductors in the LC tank circuit are cross-coupled to generate an inductance, so as to replace the MOS device originally added to the circuit externally, such that the multi-phase VCO can operates under low supply voltage and has good performance.

In order to the make aforementioned and other features and advantages of the present invention comprehensible, preferred embodiments accompanied with figures are described in detail below.

It is to be understood that both the foregoing general description and the following detailed description are exemplary, and further explanation of the invention as claimed is provided with reference to the drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
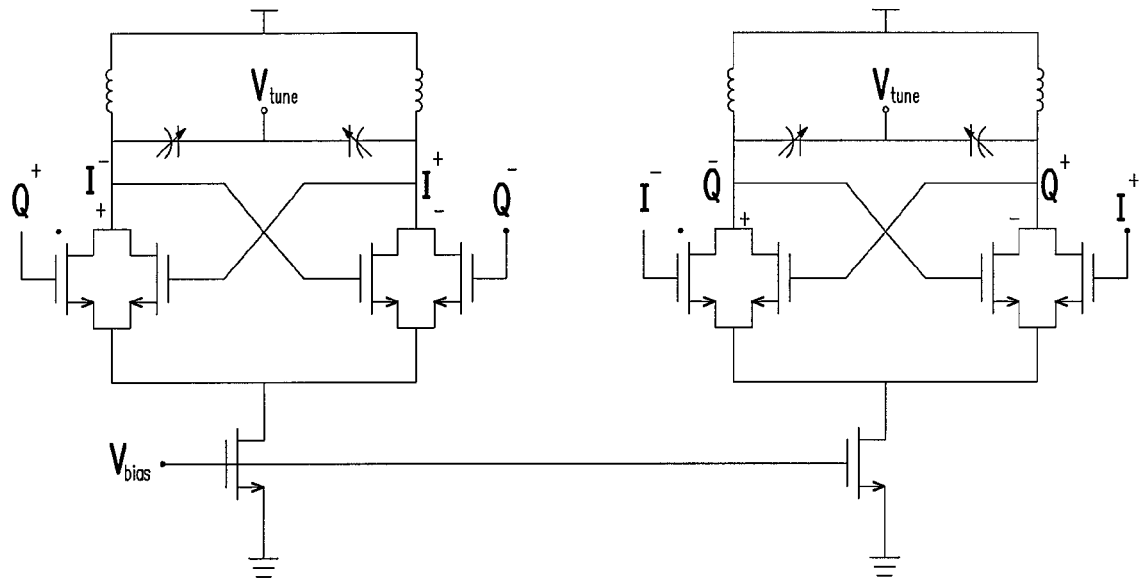
FIG. 1 is a circuit diagram of a conventional LC tank QVCO.
Figure 2:
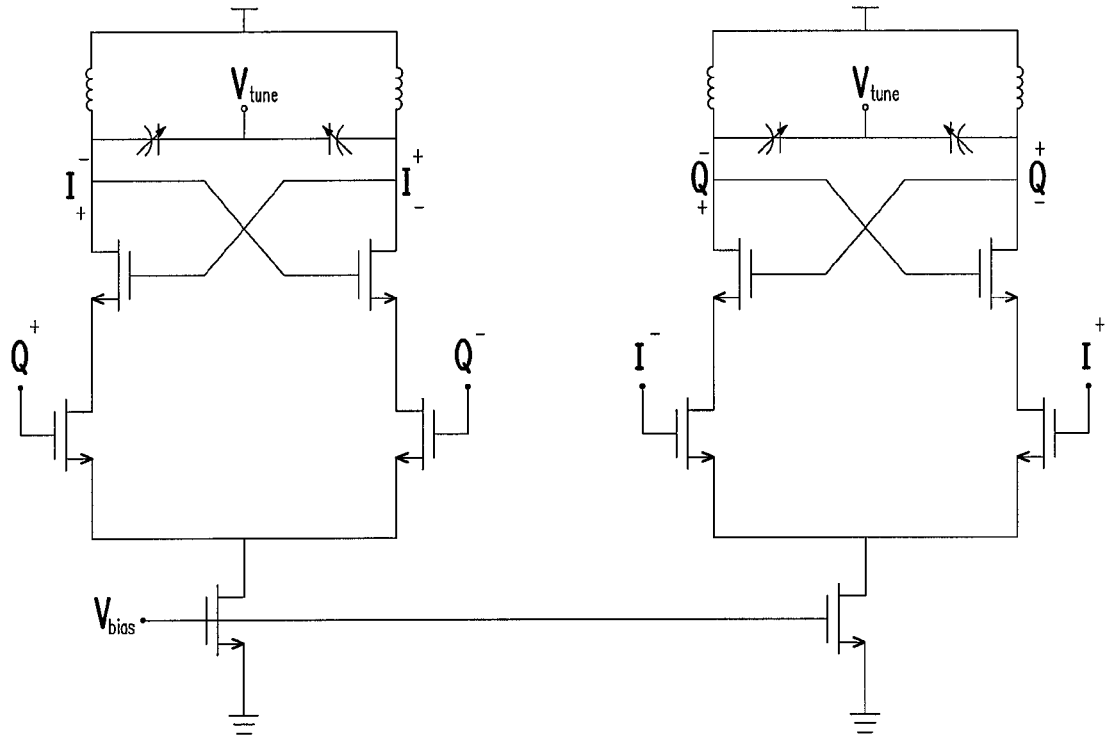
FIG. 2 is a circuit diagram of another conventional LC tank QVCO.
Figure 3:
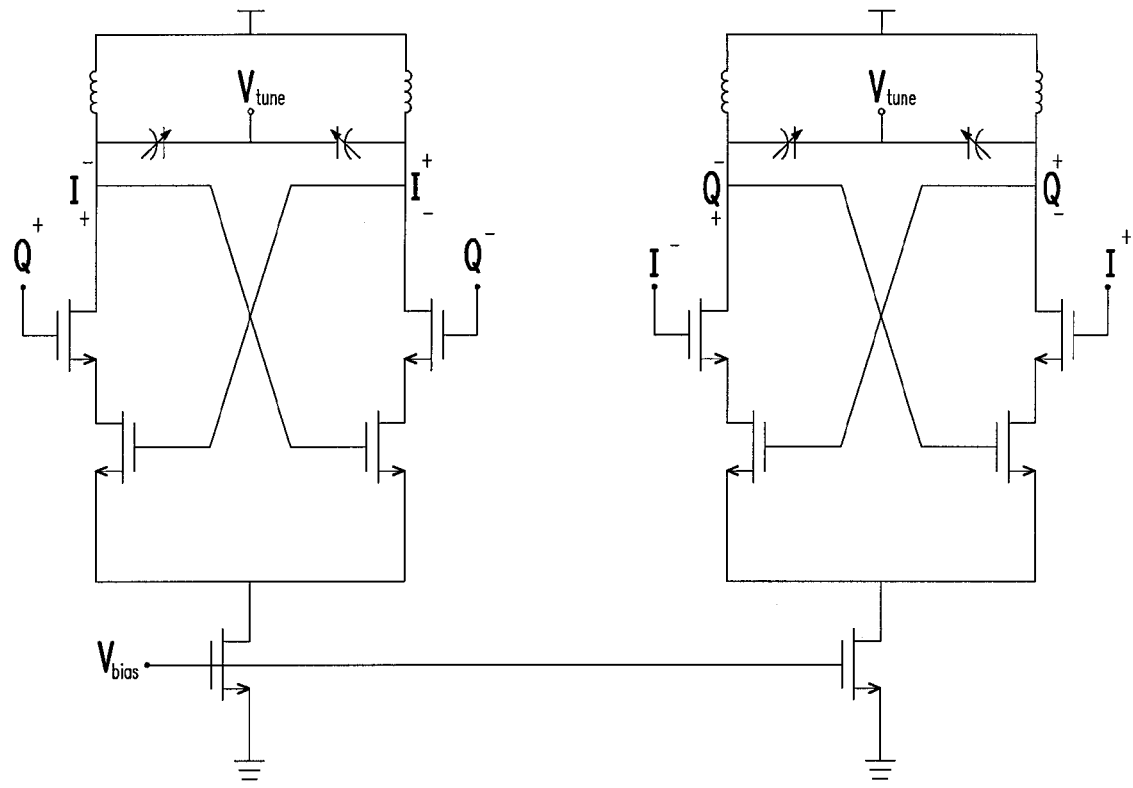
FIG. 3 is a circuit diagram of still another conventional LC tank QVCO.
Figure 4:
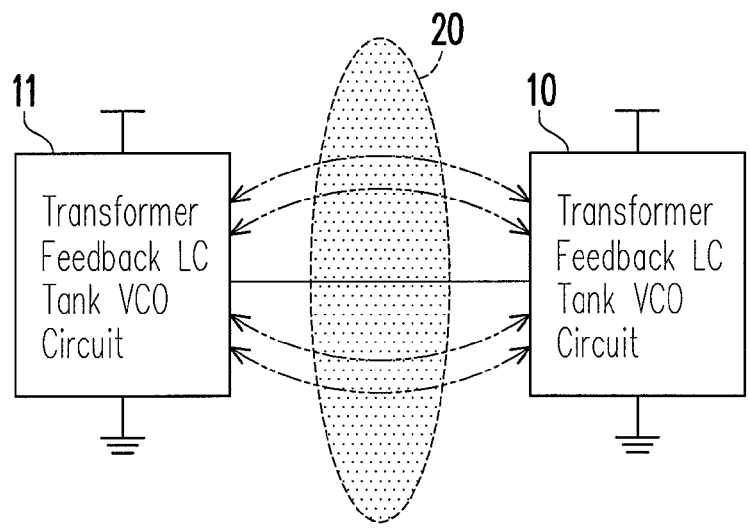
FIG. 4 is a block diagram of a QVCO according to a preferred embodiment of the present invention.

FIG. 4 is a block diagram of a multi-phase VCO according to a preferred embodiment of the present invention. The multi-phase VCO includes transformer feedback LC tank VCO circuits 10, 11 and a coupling unit 20. The transformer feedback LC tank VCO circuits 10, 11 are the main body that enables the multi-phase VCO to generate oscillating signals. The coupling unit 20 can make the originally individually-operated transformer feedback LC tank VCO circuits 10, 11 to generate the coupling of signal, thereby generating a plurality of output signals with different phases.

Figure 5:
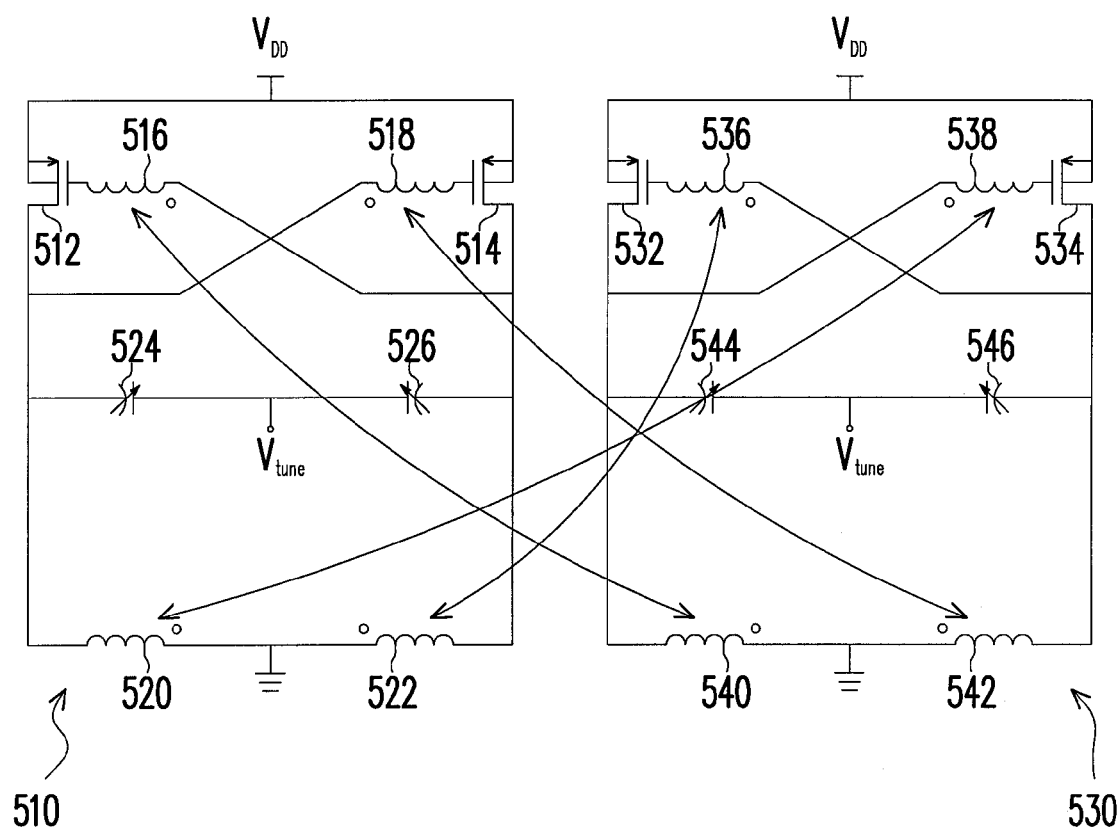
FIG. 5 is a detailed circuit diagram of a multi-phase VCO according to a first embodiment of the present invention.

FIG. 5 is a detailed circuit diagram of a multi-phase VCO according to a first embodiment of the present invention. Referring to FIG. 5, the multi-phase VCO provided by this embodiment includes VCO circuits 510 and 530. The VCO circuit 510 includes transistors 512, 514, inductors 516, 518, 520, 522, and varactors 524, 526. Moreover, the VCO circuit 530 includes transistors 532, 534, inductors 536, 538, 540, 542, and varactors 544, 546. Since the VCO circuits 510 and 530 are symmetric in the circuit structure, in the following, only the VCO circuit 510 is taken as an example for illustration, and those of ordinary skill in the art can easily deduce the structure of the VCO circuit 530.

In the VCO circuit 510, the source electrodes of the transistors 512, 514 are coupled with a voltage source VDD, and the drain electrodes are coupled to the respective gate electrodes through the inductors 518 and 516, respectively coupled to a control voltage Vtune through varactors 524, 526, and are grounded through inductors 520, 522. In a preferred embodiment, transistors 512 and 514 are, but not limited to, NMOS transistors.

It should be noted that in VCO circuits 510, 530, inductors 516, 540, inductors 518, 542, inductors 520, 538, and inductors 522, 536 can be cross-coupled to generate the mutual inductance effect, thereby generating multiple phase oscillating signals. In addition, the transistor 512 and transistor 514 are cross-coupled, and the transistor 532 and the transistor 534 are cross-coupled, so as to generate the negative resistance to compensate an equivalent parasitic impedance generated by the inductors 520, 522, 540, 542 and varactors 524, 526, 544, 546 and to make the transformer feedback LC tank VCO circuits 10, 11 keep oscillating.

In addition, inductors 516, 518, 536, 538 are used to obtain feedback signals, so as to improve the performance of the circuit. The varactor is constituted of MOS transistor or P-N diode, and the varactor is coupled to the control voltage Vtune, so as to change the oscillating frequency of the LC tank.

Figure 6:
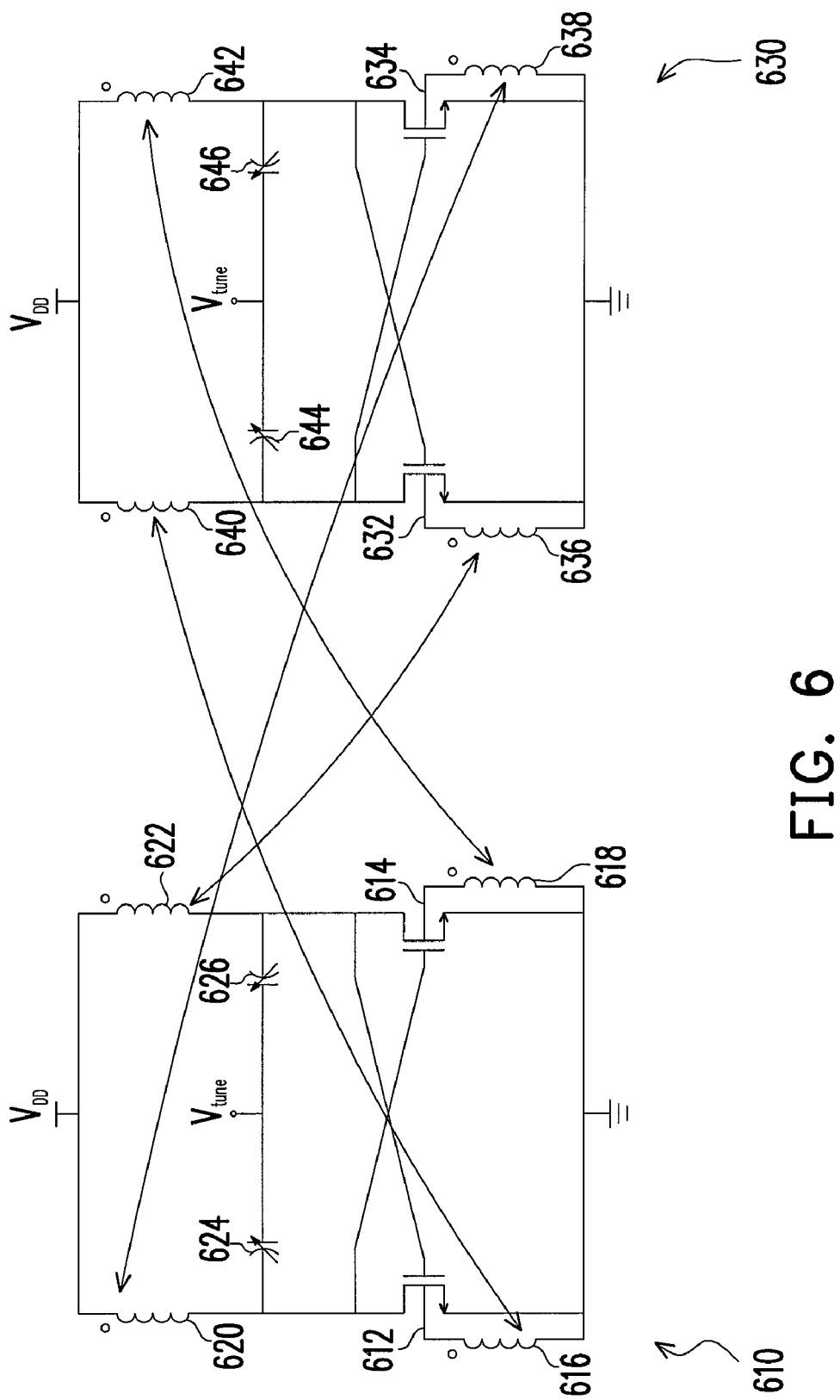
FIG. 6 is a detailed circuit diagram of a multi-phase VCO according to a second embodiment of the present invention.

FIG. 6 is a detailed circuit diagram of a multi-phase VCO according to a second embodiment of the present invention. Referring to FIGS. 5 and 6, the multi-phase VCO provided by this embodiment includes VCO circuits 610, 630. The VCO circuit 610 includes transistors 612, 614, inductors 616, 618, 620, 622, and varactors 624, 626. In this embodiment, transistors 612, 614 are, for example, NMOS transistors, and the drain electrodes thereof are respectively coupled to a voltage source VDD through inductors 620, 622, and are respectively coupled to a control voltage Vtune through varactors 624, 626, and the source electrodes are grounded together. In addition, the gate electrodes of the transistors 612, 614 are respectively coupled to the drain electrodes. Further, the back gate electrode of the transistor 612 can be grounded through the inductor 616. Similarly, the back gate electrode of the transistor 614 is grounded through the inductor 618.

In another aspect, the VCO circuit 630 includes transistors 632, 634, inductors 636, 638, 640, 642, and varactors 644, 646. The circuit structure of the VCO circuit 630 may be referred to the coupling manner of the VCO circuit 610. The inductor 636 and the inductor 622 are cross-coupled, and the inductor 638 and the inductor 620 are cross-coupled, so as to generate oscillating signals of different phases. In addition, the inductor 640 and the inductor 616 are cross-coupled, and the inductor 642 and the inductor 618 are cross-coupled, so as to generate a quadrature-phase oscillating signal.

Figure 7:
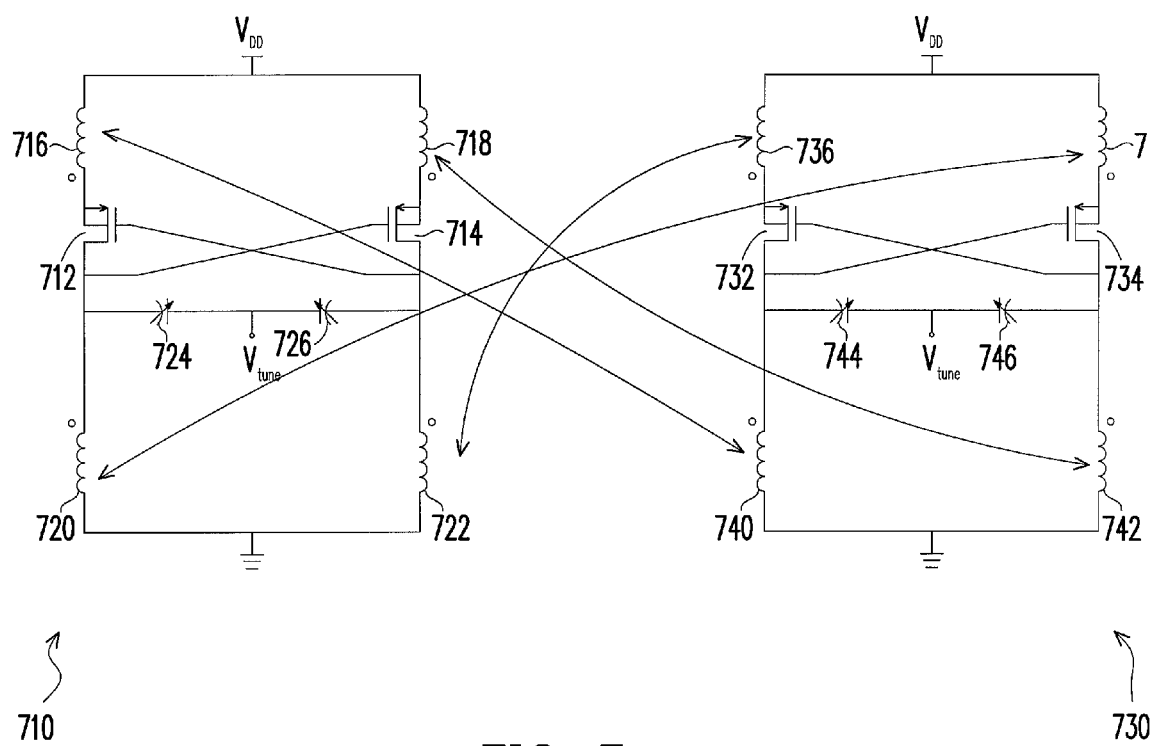
FIG. 7 is a detailed circuit diagram of a multi-phase VCO according to a third embodiment of the present invention.

FIG. 7 is a detailed circuit diagram of a multi-phase VCO according to a third embodiment of the present invention. Referring to FIG. 7, the multi-phase VCO provided by this embodiment includes VCO circuits 710 and 730, and the circuit structures of the VCO circuits 710, 730 are substantially the same. Therefore, the VCO circuit 710 is taken as an example for illustration as follows.

The VCO circuit 710 includes transistors 712 and 714, inductors 716, 718, 720, 722, and varactors 724, 726. The transistors 712 and 714 can be PMOS transistors, the source electrodes thereof are respectively coupled to the voltage source VDD through the inductors 716 and 718, and the drain electrodes are coupled to the respective gate electrodes, coupled to the control voltage Vtune through the varactors 724, 726, and are grounded through the inductors 720, 722.

Similarly, the VCO circuit 730 also includes transistors 732, 734, inductors 736, 738, 740, 742, and varactors 744, 746, and the coupling manner can be referred to the circuit structure of the VCO circuit 710. The inductors 736, 722, the inductors 738, 720, the inductors 716, 740, and the inductors 742, 718 are cross-coupled, so as to generate the oscillating signals of different phases.

Figure 8:
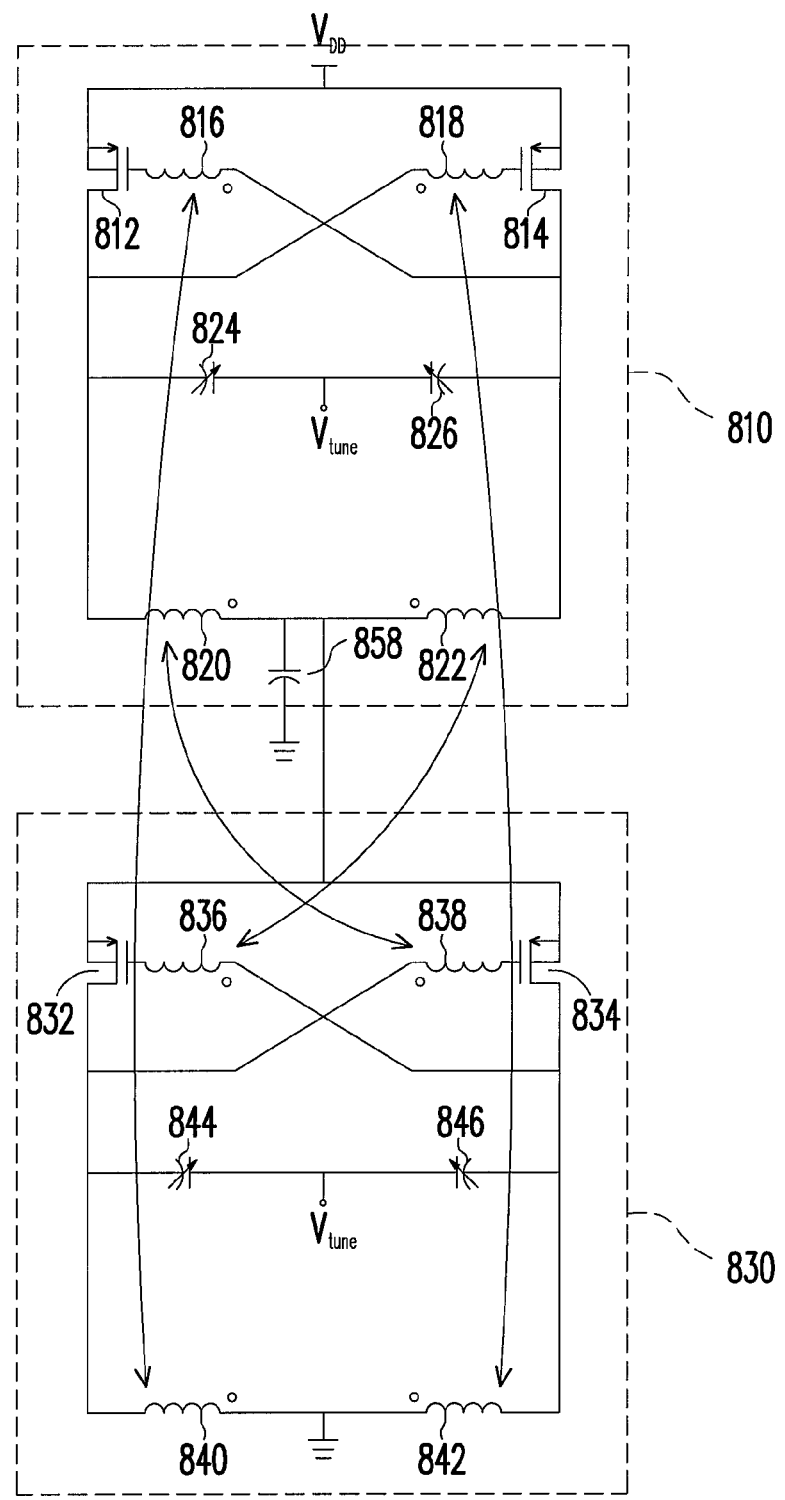
FIG. 8 is a detailed circuit diagram of a multi-phase VCO according to a fourth embodiment of the present invention.

FIG. 8 is a detailed circuit diagram of a multi-phase VCO according to a fourth embodiment of the present invention. Referring to FIG. 8, the VCO provided by this embodiment includes VCO circuits 810, 830 which are electrically connected to each other and have mostly the same circuit structures. The VCO 810 includes transistors 812, 814, inductors 816, 818, 820, 822, varactors 824, 826, and a capacitor 858. The transistors 812 and 814 can be PMOS transistors, and the source electrodes thereof are coupled to the voltage source VDD, and the drain electrodes are coupled to the respective gate electrodes through the inductors 818, 816, coupled to the control voltage Vtune through varactors 824 and 826, and are electrically connected to the VCO circuit 830 through inductors 820, 822.

In addition, in the VCO circuit 810, the capacitor 858 is used to ground the coupled node of the inductors 820, 822.

In another aspect, the VCO circuit 830 includes transistors 832, 834, inductors 836, 838, 840, 842, and varactors 844, 846. The transistors 832, 834 are also NMOS transistors, the source electrodes are coupled to the VCO circuit 810, and the drain electrodes are coupled to the respective gate electrodes through inductors 838 and 836, coupled to the control voltage Vtune through varactors 844, 846, and are respectively grounded through inductors 840, 842.

Similarly, in this embodiment, the inductors 816, 840, the inductors 818, 842, and the inductors 820, 838, and the inductors 822, 836 are cross-coupled, so as to generate a quadrature-phase oscillating signal.

The architecture disclosed in FIG. 8 makes use of the concept of repeated use of the current to greatly reduce the power consumption of the entire circuit. In FIG. 8, the mutual inductance relation between inductors can be used to replace the additionally added MOS device generating the coupled signals in the original circuit, which can also achieve the coupling of signal and generate the quadrature-phase output signal. For the conventional circuit architecture repeatedly using the current, the additionally added MOS devices require for a lot of isolating capacitors and bias resistors to control the DC-bias level of the MOS devices, and this embodiment can solve the above problem.

Figure 9:
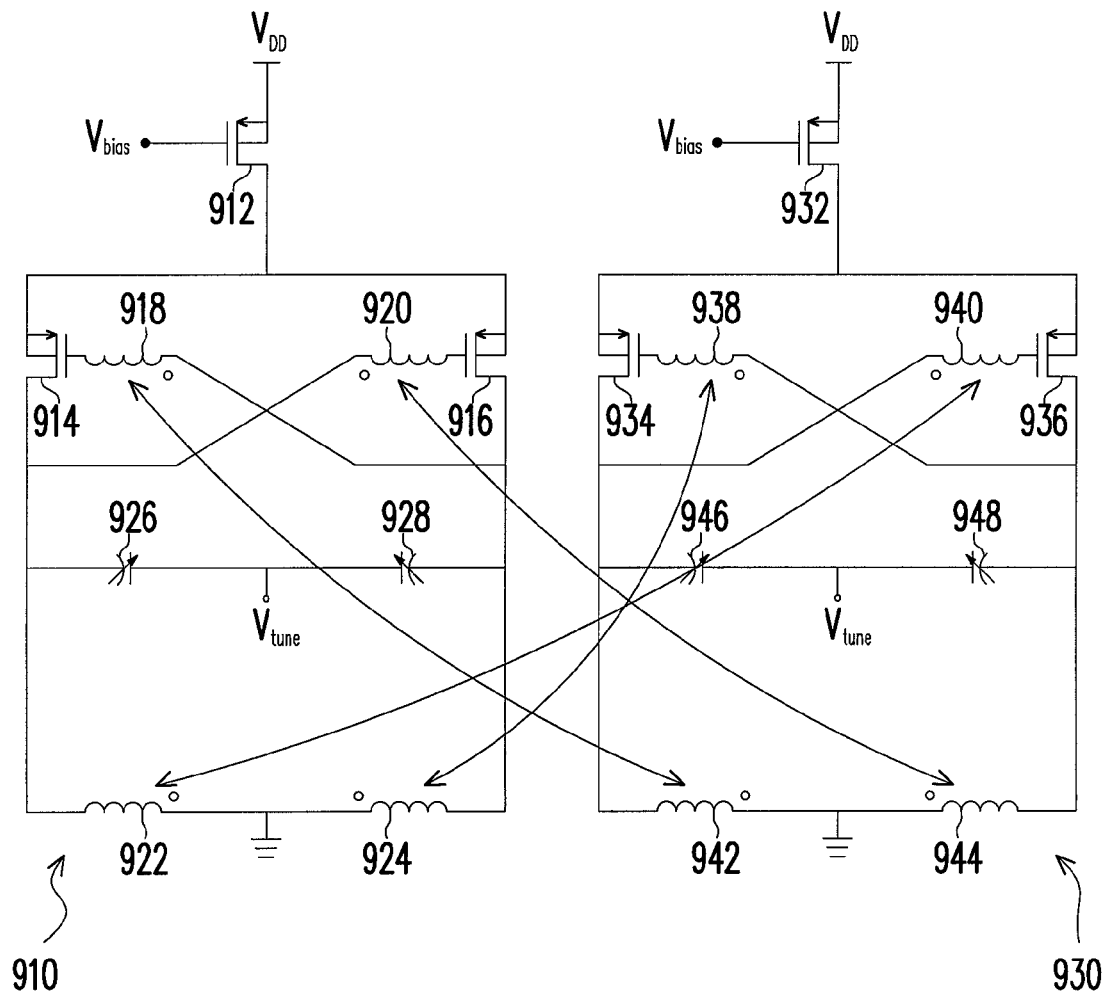
FIG. 9 is a detailed circuit diagram of a multi-phase VCO according to a fifth embodiment of the present invention.

FIG. 9 is a detailed circuit diagram of a multi-phase VCO according to a fifth embodiment of the present invention. Referring to FIG. 9, the VCO provided by this embodiment also includes VCO circuits 910 and 930. The VCO circuit 910 includes transistors 912, 914, 916, inductors 918, 920, 922, 924, and varactors 926, 928. The transistors 912, 914, 916 may be PMOS transistors, and the transistors 912 and 932 functions as the current source to provide and limit the overall current consumption of the circuit. The source electrode of the transistor 912 is coupled to the voltage source VDD, and the gate electrode is coupled to the bias voltage Vbias, and the drain electrode is coupled to the source electrodes of the transistors 914, 916. The drain electrodes of the transistors 914, 916 are coupled to the respective gate electrodes through the inductors 920, 918, coupled to the control voltage Vtune through the varactors 926, 928, and are respectively grounded through inductors 922, 924.

The VCO circuit 930 includes transistors 932, 934, 936, inductors 938, 840, 942, 944, and varactors 946, 948. The circuit structure of VCO circuit 930 can be referred to the VCO circuit 910. The inductors 918, 942, inductors 920, 944, inductors 922, 940, and inductors 924, 938 are cross-coupled to generate oscillating signals of different phases.

Figure 10:
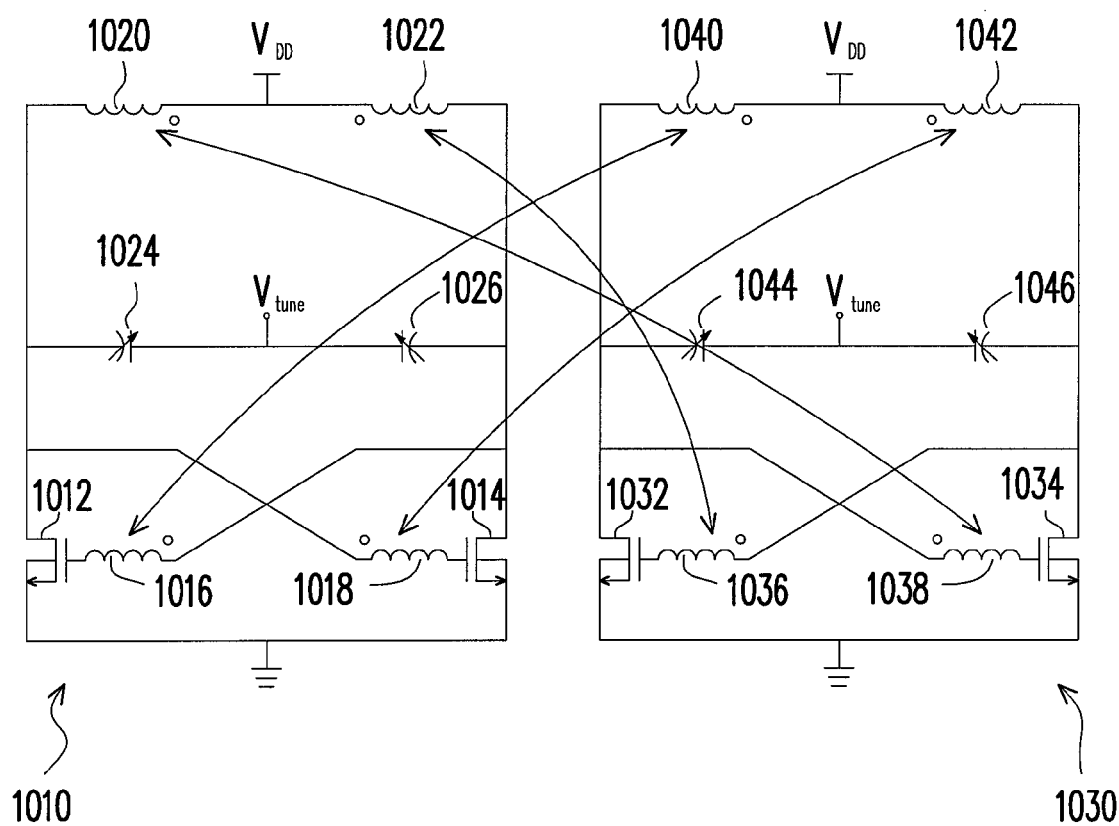
FIG. 10 is a detailed circuit diagram of the QVCO according to another embodiment of the present invention.

FIG. 10 is a detailed circuit diagram of a multi-phase VCO according to a sixth embodiment of the present invention. Referring to FIG. 10, the VCO provided by this embodiment is a variation of the VCO provided by the first embodiment (FIG. 5), and the difference lies in that the PMOS transistor is substituted by the NMOS transistor. Similarly, the VCO provided by this embodiment also includes same VCO circuits 1010 and 1030.

The VCO circuit 1010 includes transistors 1012, 1014, inductors 1016, 1016, 1020, 1022, and varactors 1024, 1026. The transistors 1012, 1014 can be PMOS transistors, the source electrodes are grounded, the drain electrodes are coupled to the respective gate electrodes through the inductors 1018, 1016, coupled to the control voltage Vtune through the varactors 1024, 1026, and are coupled to the voltage source VDD through the inductors 1020, 1022.

Similarly, the VCO circuit 1010 also includes transistors 1032, 1034, inductors 1036, 1038, 1040, 1042, and varactors 1044, 1046. The inductors 1016, 1040, the inductors 1018, 1042, inductors 1020, 1038, and inductors 1022, 1036 are cross-coupled with each other, so as to generate the oscillating signals of difference phase.

To sum up, the present invention adopts a new design concept, in which the individually-operated inductors in the LC tank circuit are utilized to generate inductance, so as to replace the original MOS device added on the circuit externally, such that the multi-phase VCO can operates under low supply voltage, the power consumption is effectively reduced, and the preferred performance is provided.

It will be apparent to those skilled in the art that various modifications and variations can be made to the structure of the present invention without departing from the scope or spirit of the invention. In view of the foregoing, the present invention covers modifications and variations of this invention provided they fall within the scope of the following claims and their equivalents.

What is claimed is:

1. A multi-phase voltage-control oscillator (VCO), comprising:
    a first VCO circuit; and
    a second VCO circuit, wherein the second VCO circuit and the first VCO circuit have a plurality of inductors, and the inductors in the second VCO circuit are respectively cross-coupled with the inductors in the first VCO circuit to generate a mutual inductance effect, so as to output a plurality of oscillating signals with different phases, wherein the first VCO circuit comprises:
    a first NMOS transistor having a second source/drain electrode grounded;
    a second NMOS transistor having a second source/drain electrode grounded, and a gate electrode coupled to the first source/drain electrode of the first NMOS transistor;
    a first inductor for grounding a back gate electrode of the first NMOS transistor;
    a second inductor for grounding a back gate electrode of the second NMOS transistor;
    a first varactor for coupling a first source/drain electrode of the first NMOS transistor to a control voltage;
    a second varactor for coupling a first source/drain electrode of the second NMOS transistor to the control voltage;
    a third inductor for coupling the first source/drain electrode of the first NMOS transistor to a voltage source; and
    a fourth inductor for coupling the first source/drain electrode of the second NMOS transistor to the voltage source.

2. The multi-phase VCO as claimed in claim 1, wherein the second VCO circuit comprises:

a third NMOS transistor having a second source/drain electrode grounded;

a fourth NMOS transistor having a second source/drain electrode grounded and a gate electrode coupled to a first source/drain electrode of the third NMOS transistor;

a fifth inductor for grounding a back gate electrode of the third NMOS transistor, and cross-coupled with the fourth inductor to generate a first oscillating signal;

a sixth inductor for grounding a back gate electrode of the fourth NMOS transistor, and cross-coupled with the third inductor to generate a second oscillating signal;

a third varactor for coupling a first source/drain electrode of the third NMOS transistor to the control voltage;

a fourth varactor for coupling a first source/drain electrode of the fourth NMOS transistor to the control voltage;

a seventh inductor for coupling the first source/drain electrode of the third NMOS transistor to the voltage source, and cross-coupled with the first inductor to generate a third oscillating signal; and an eighth inductor for coupling a first source/drain electrode of the fourth NMOS transistor to the voltage source, and cross-coupled with the second inductor to generate a fourth oscillating signal.

* * * * *